United States Patent
Cho et al.

(10) Patent No.: US 9,966,335 B2
(45) Date of Patent: May 8, 2018

(54) SEMICONDUCTOR DEVICE AND METHOD OF FORMING INTERPOSER FRAME ELECTRICALLY CONNECTED TO EMBEDDED SEMICONDUCTOR DIE

(71) Applicant: STATS ChipPAC, Ltd., Singapore (SG)

(72) Inventors: NamJu Cho, Gyeonggi-do (KR); HeeJo Chi, Kyoungki-do (KR); HanGil Shin, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 79 days.

(21) Appl. No.: 14/596,080

(22) Filed: Jan. 13, 2015

(65) Prior Publication Data

US 2015/0123273 A1    May 7, 2015

Related U.S. Application Data

(63) Continuation of application No. 13/714,061, filed on Dec. 13, 2012, now Pat. No. 8,932,907, which is a
(Continued)

(51) Int. Cl.
*H01L 23/50* (2006.01)
*H01L 21/56* (2006.01)
(Continued)

(52) U.S. Cl.
CPC .............. *H01L 23/50* (2013.01); *H01L 21/56* (2013.01); *H01L 21/561* (2013.01);
(Continued)

(58) Field of Classification Search
CPC .......... H01L 23/50; H01L 23/12; H01L 23/28
(Continued)

(56) References Cited

U.S. PATENT DOCUMENTS

| 5,250,843 A | 10/1993 | Eichelberger |
| 5,353,498 A | 10/1994 | Fillion et al. |

(Continued)

OTHER PUBLICATIONS

14596080_20170511 opening 1997 Merriam-Webster 201705111610.*

*Primary Examiner* — Mamadou Diallo
(74) *Attorney, Agent, or Firm* — Robert D. Atkins; Patent Law Group: Atkins and Associates, P.C.

(57) ABSTRACT

A semiconductor device has an interposer frame mounted over a carrier. A semiconductor die has an active surface and bumps formed over the active surface. The semiconductor die can be mounted within a die opening of the interposer frame or over the interposer frame. Stacked semiconductor die can also be mounted within the die opening of the interposer frame or over the interposer frame. Bond wires or bumps are formed between the semiconductor die and interposer frame. An encapsulant is deposited over the interposer frame and semiconductor die. An interconnect structure is formed over the encapsulant and bumps of the first semiconductor die. An electronic component, such as a discrete passive device, semiconductor die, or stacked semiconductor die, is mounted over the semiconductor die and interposer frame. The electronic component has an I/O count less than an I/O count of the semiconductor die.

9 Claims, 13 Drawing Sheets

Related U.S. Application Data continuation of application No. 12/947,442, filed on Nov. 16, 2010, now Pat. No. 8,384,227.

(51) Int. Cl.

| | |
|---|---|
| *H01L 21/683* | (2006.01) |
| *H01L 23/13* | (2006.01) |
| *H01L 23/498* | (2006.01) |
| *H01L 25/065* | (2006.01) |
| *H01L 23/12* | (2006.01) |
| *H01L 23/28* | (2006.01) |
| H01L 23/29 | (2006.01) |
| H01L 23/31 | (2006.01) |
| H01L 23/00 | (2006.01) |
| H05K 3/00 | (2006.01) |

(52) U.S. Cl.
CPC ........ *H01L 21/568* (2013.01); *H01L 21/6835* (2013.01); *H01L 23/12* (2013.01); *H01L 23/13* (2013.01); *H01L 23/28* (2013.01); *H01L 23/498* (2013.01); *H01L 23/49811* (2013.01); *H01L 23/49816* (2013.01); *H01L 23/49833* (2013.01); *H01L 24/11* (2013.01); *H01L 24/17* (2013.01); *H01L 24/19* (2013.01); *H01L 24/20* (2013.01); *H01L 24/49* (2013.01); *H01L 24/73* (2013.01); *H01L 24/81* (2013.01); *H01L 24/85* (2013.01); *H01L 24/97* (2013.01); *H01L 25/0657* (2013.01); H01L 21/565 (2013.01); H01L 23/295 (2013.01); H01L 23/3107 (2013.01); H01L 23/3128 (2013.01); H01L 24/03 (2013.01); H01L 24/05 (2013.01); H01L 24/13 (2013.01); H01L 24/16 (2013.01); H01L 24/29 (2013.01); H01L 24/32 (2013.01); H01L 24/48 (2013.01); H01L 2221/68327 (2013.01); H01L 2221/68381 (2013.01); H01L 2221/68386 (2013.01); H01L 2224/0345 (2013.01); H01L 2224/03452 (2013.01); H01L 2224/03462 (2013.01); H01L 2224/03464 (2013.01); H01L 2224/0401 (2013.01); H01L 2224/04042 (2013.01); H01L 2224/04105 (2013.01); H01L 2224/05611 (2013.01); H01L 2224/05624 (2013.01); H01L 2224/05639 (2013.01); H01L 2224/05644 (2013.01); H01L 2224/05647 (2013.01); H01L 2224/05655 (2013.01); H01L 2224/06131 (2013.01); H01L 2224/06135 (2013.01); H01L 2224/1132 (2013.01); H01L 2224/1134 (2013.01); H01L 2224/1145 (2013.01); H01L 2224/11334 (2013.01); H01L 2224/11462 (2013.01); H01L 2224/11464 (2013.01); H01L 2224/11849 (2013.01); H01L 2224/11901 (2013.01); H01L 2224/12105 (2013.01); H01L 2224/131 (2013.01); H01L 2224/13111 (2013.01); H01L 2224/13113 (2013.01); H01L 2224/13116 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/21 (2013.01); H01L 2224/2105 (2013.01); H01L 2224/215 (2013.01); H01L 2224/22 (2013.01); H01L 2224/221 (2013.01); H01L 2224/2919 (2013.01); H01L 2224/29144 (2013.01); H01L 2224/32013 (2013.01); H01L 2224/32059 (2013.01); H01L 2224/32145 (2013.01); H01L 2224/32225 (2013.01); H01L 2224/32245 (2013.01); H01L 2224/33181 (2013.01); H01L 2224/48091 (2013.01); H01L 2224/48101 (2013.01); H01L 2224/48105 (2013.01); H01L 2224/48145 (2013.01); H01L 2224/48157 (2013.01); H01L 2224/48175 (2013.01); H01L 2224/48227 (2013.01); H01L 2224/48228 (2013.01); H01L 2224/48247 (2013.01); H01L 2224/49 (2013.01); H01L 2224/73215 (2013.01); H01L 2224/73227 (2013.01); H01L 2224/73265 (2013.01); H01L 2224/73267 (2013.01); H01L 2224/85005 (2013.01); H01L 2224/85447 (2013.01); H01L 2224/92163 (2013.01); H01L 2224/92164 (2013.01); H01L 2224/95001 (2013.01); H01L 2224/97 (2013.01); H01L 2225/0651 (2013.01); H01L 2225/06506 (2013.01); H01L 2225/06517 (2013.01); H01L 2225/06568 (2013.01); H01L 2924/00011 (2013.01); H01L 2924/00014 (2013.01); H01L 2924/014 (2013.01); H01L 2924/01013 (2013.01); H01L 2924/01029 (2013.01); H01L 2924/01033 (2013.01); H01L 2924/01047 (2013.01); H01L 2924/01049 (2013.01); H01L 2924/01073 (2013.01); H01L 2924/01074 (2013.01); H01L 2924/01079 (2013.01); H01L 2924/01082 (2013.01); H01L 2924/01322 (2013.01); H01L 2924/12041 (2013.01); H01L 2924/12042 (2013.01); H01L 2924/1306 (2013.01); H01L 2924/13091 (2013.01); H01L 2924/14 (2013.01); H01L 2924/146 (2013.01); H01L 2924/1433 (2013.01); H01L 2924/1434 (2013.01); H01L 2924/14335 (2013.01); H01L 2924/15311 (2013.01); H01L 2924/171 (2013.01); H01L 2924/181 (2013.01); H01L 2924/18161 (2013.01); H01L 2924/18162 (2013.01); H01L 2924/18165 (2013.01); H01L 2924/19041 (2013.01); H01L 2924/19042 (2013.01); H01L 2924/19043 (2013.01); H01L 2924/19104 (2013.01); H01L 2924/19105 (2013.01); H05K 3/0052 (2013.01)

(58) Field of Classification Search
USPC ................ 257/686, 724, 778, 787, E25.013, 257/E21.449, E23.85
See application file for complete search history.

(56) References Cited

U.S. PATENT DOCUMENTS

| | | | |
|---|---|---|---|
| 5,841,193 | A | 11/1998 | Eichelberger |
| 6,815,254 | B2 | 11/2004 | Mistry et al. |
| 7,355,274 | B2 | 4/2008 | Lim |
| 7,619,901 | B2 | 11/2009 | Eichelberger et al. |
| 2002/0142513 | A1 | 10/2002 | Fee et al. |
| 2004/0217471 | A1* | 11/2004 | Haba .................. H01L 23/4985 257/734 |
| 2009/0243071 | A1 | 10/2009 | Ha et al. |
| 2010/0025833 | A1 | 2/2010 | Pagaila et al. |
| 2010/0127361 | A1 | 5/2010 | Kuan et al. |

* cited by examiner

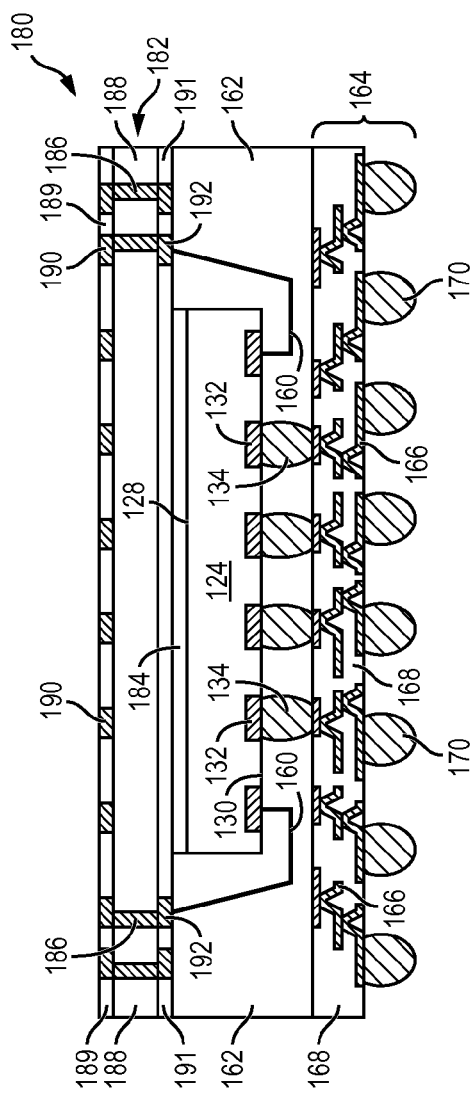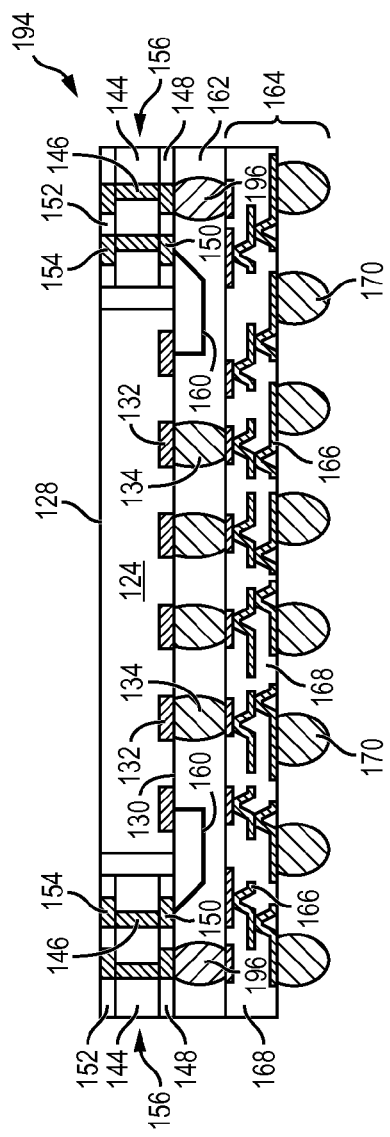

SEMICONDUCTOR DEVICE AND METHOD OF FORMING INTERPOSER FRAME ELECTRICALLY CONNECTED TO EMBEDDED SEMICONDUCTOR DIE

CLAIM TO DOMESTIC PRIORITY

The present application is a continuation of U.S. patent application Ser. No. 13/714,061, now U.S. Pat. No. 8,932,907, filed Dec. 13, 2012, which is a continuation of U.S. patent application Ser. No. 12/947,442, now U.S. Pat. No. 8,384,227, filed Nov. 16, 2010, which applications are incorporated herein by reference.

FIELD OF THE INVENTION

The present invention relates in general to semiconductor devices and, more particularly, to a semiconductor device and method of forming an interposer frame electrically connected to an embedded semiconductor die with bumps and bond wires.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a conventional fan-out wafer level chip scale package (Fo-WLCSP), a semiconductor die is typically enclosed by an encapsulant. A top and bottom build-up interconnect structure are formed over opposite surfaces of the encapsulant. A redistribution layer (RDL) and insulating layer are commonly formed within the top and bottom build-up interconnect structures. In addition, a conductive pillar is typically formed through the encapsulant for z-direction vertical electrical interconnect between the top and bottom interconnect structures.

When stacking semiconductor devices, the interconnect requirements of each device must be considered. Some high-performance semiconductor devices, e.g. ASIC and DSP, require high input/output (I/O) count and high vertical interconnect capability, as well as adequate heat dissipation. Other semiconductor devices, such as memory, have fewer interconnect requirements. The vertical interconnect arrangement for stacking dissimilar semiconductor devices calls for particular attention of the specific interconnect requirements of each level.

SUMMARY OF THE INVENTION

A need exists for a vertical interconnect arrangement adapted for semiconductor devices having dissimilar I/O requirements. Accordingly, in one embodiment, the present invention is a semiconductor device comprising an interposer frame including a die opening. A first semiconductor die is disposed within the die opening of the interposer frame. A first interconnect structure is formed between the first semiconductor die and interposer frame. A second interconnect structure is formed over the first semiconductor die.

In another embodiment, the present invention is a semiconductor device comprising an interposer. A first semiconductor die is disposed adjacent to the interposer. A first interconnect structure is formed between the first semiconductor die and interposer. A second interconnect structure is formed over the first semiconductor die.

In another embodiment, the present invention is a method of making a semiconductor device comprising the steps of providing an interposer, disposing a first semiconductor die within an opening in the interposer, forming a first interconnect structure between the first semiconductor die and interposer, and forming a second interconnect structure over the first semiconductor die.

In another embodiment, the present invention is a method of making a semiconductor device comprising the steps of providing an interposer, disposing a first semiconductor die adjacent to the interposer, forming a first interconnect structure between the first semiconductor die and interposer, and forming a second interconnect structure over the first semiconductor die.

BRIEF DESCRIPTION OF THE DRAWINGS

FIG. 6 illustrates the semiconductor die mounted adjacent to the interposer frame and electrically connected with bumps and bond wires;

FIG. 7 illustrates the interposer frame and embedded semiconductor die electrically connected with bumps and bond wires;

DETAILED DESCRIPTION OF THE DRAWINGS

Figure 1:
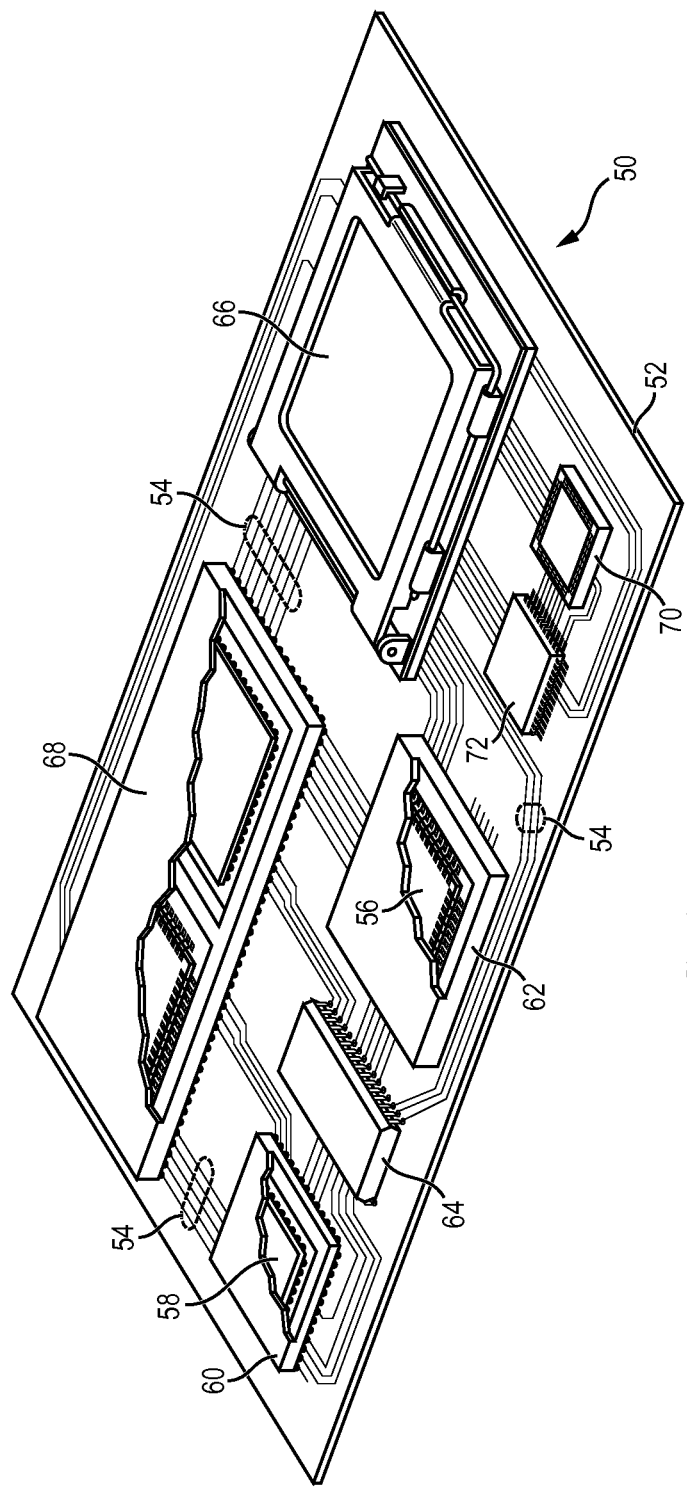
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
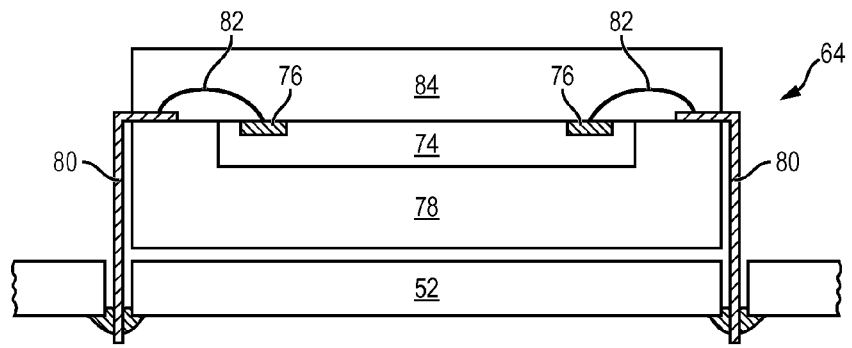
FIGS. 2a-2c illustrate further detail of the representative semiconductor packages mounted to the PCB.
Figure 2B:
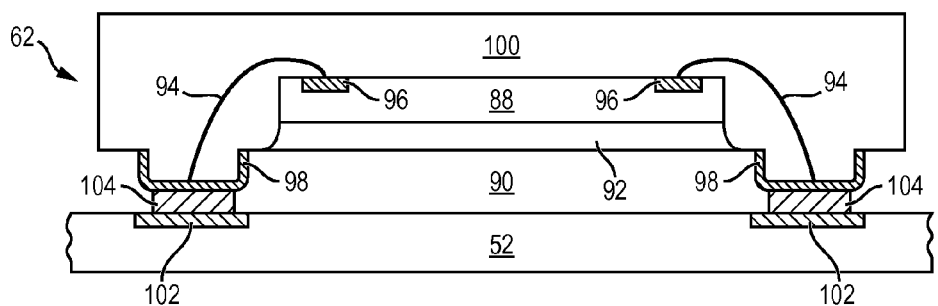
Figure 2C:
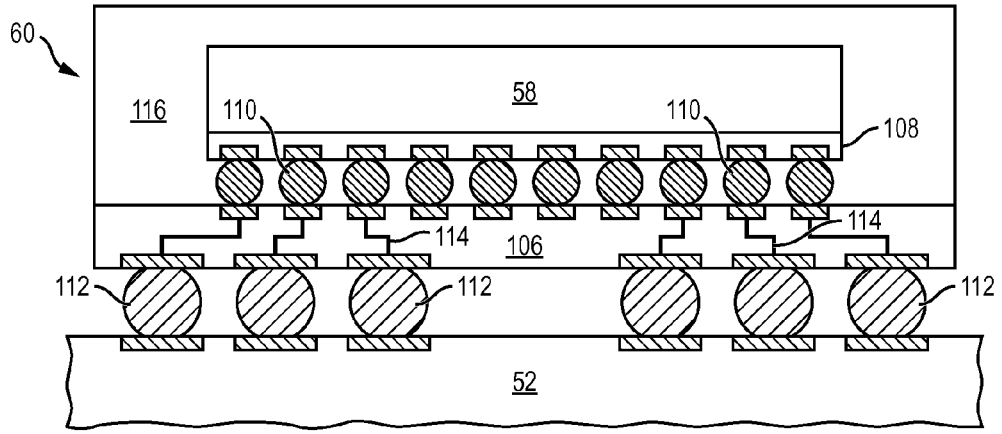

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
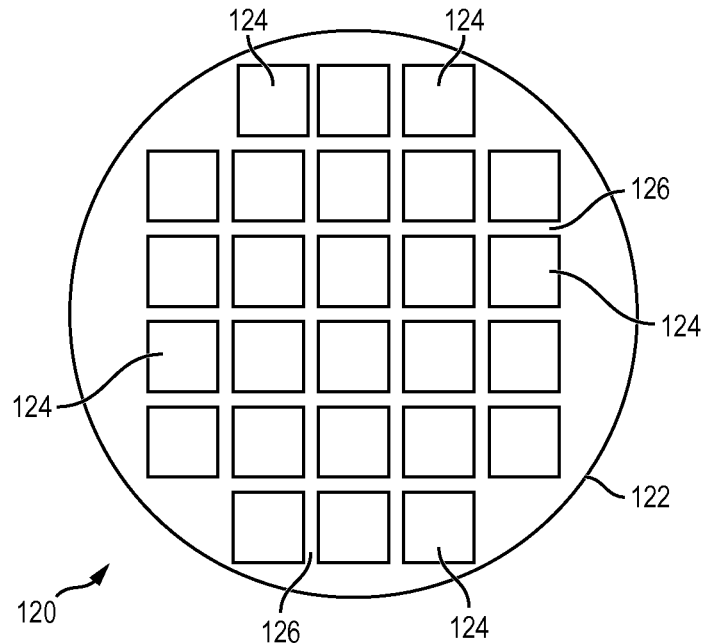
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
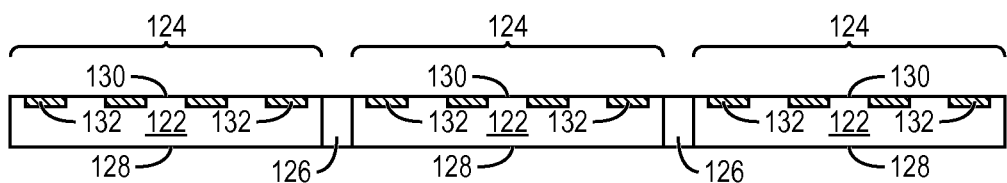

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form spherical balls or bumps 134. In some applications, bumps 134 are reflowed a second time to improve electrical contact to contact pads 132. The bumps can also be compression bonded to contact pads 132. Bumps 134 represent one type of interconnect structure that can be formed over contact pads 132. The interconnect structure can also use stud bump, micro bump, conductive pillars, or other electrical interconnect. Bumps 134 are electrically connected through contact pads 132 to circuits contained in active surface 130.

Figure 3C:
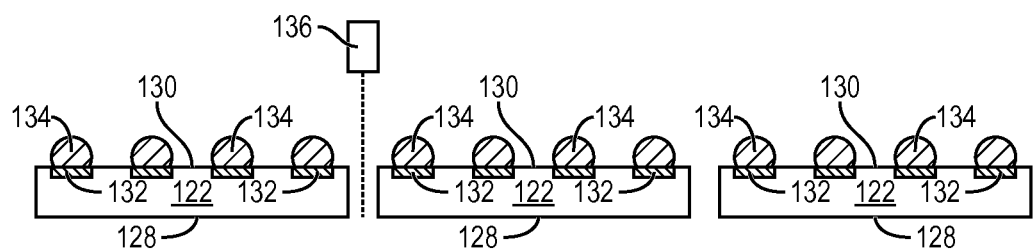

In FIG. 3c, semiconductor wafer 120 is singulated through saw street 126 using a saw blade or laser cutting tool 136 into individual semiconductor die 124.

Figure 4A:
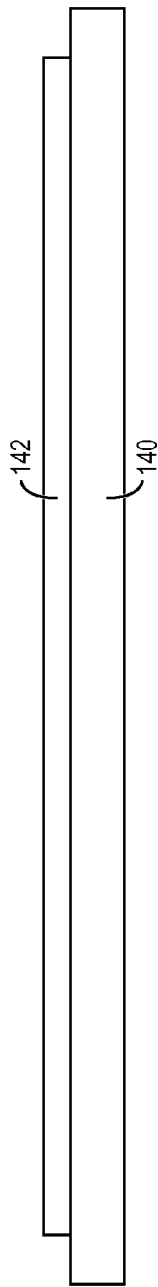
FIGS. 4a-4i illustrate a process of forming an interposer frame and embedded semiconductor die electrically connected with bumps and bond wires.

FIG. 4a-4i illustrate, in relation to FIGS. 1 and 2a-2c, a process of forming an interposer frame and embedded semiconductor die electrically connected with bumps and bond wires. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

Figure 4B:
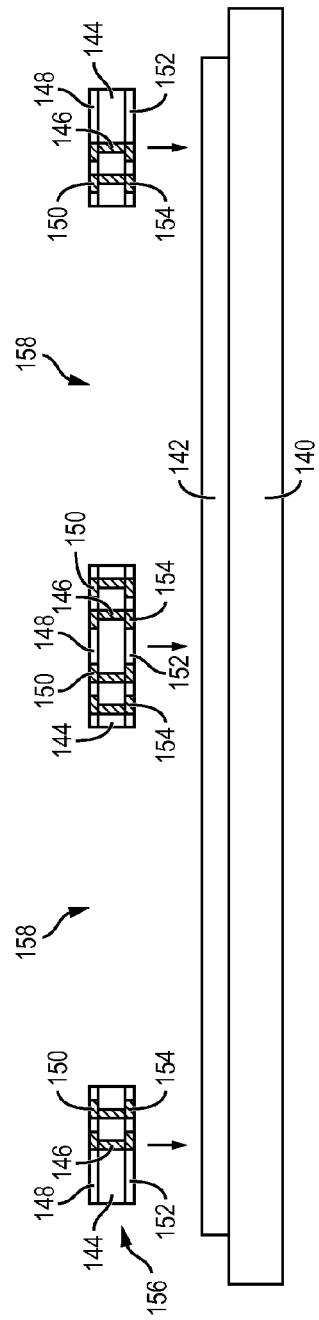

In FIG. 4b, a semiconductor wafer or substrate 144 contains a base material, such as silicon, germanium, gallium arsenide, indium phosphide, or silicon carbide, for structural support. As a semiconductor wafer, substrate 144 can contain embedded semiconductor die or passive devices. Substrate 144 can also be a multi-layer laminate, ceramic, tape, or leadframe.

A plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other material having similar insulating and structural properties. A portion of insulating layer 148 is removed by an etching process to expose substrate 144 and conductive vias 146.

An electrically conductive layer or RDL 150 is formed over the exposed substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

An insulating or passivation layer 152 is formed over an opposing surface of substrate 144 and conductive vias 146 using PVD, CVD, printing, spin coating, spray coating, sintering or thermal oxidation. The insulating layer 152 contains one or more layers of SiO2, Si3N4, SiON, Ta2O5, Al2O3, polyimide, BCB, PBO, or other material having similar insulating and structural properties. A portion of insulating layer 152 is removed by an etching process to expose substrate 144 and conductive vias 146.

An electrically conductive layer or RDL 154 is formed over the exposed substrate 144 and conductive vias 146 using a patterning and metal deposition process such as printing, PVD, CVD, sputtering, electrolytic plating, and electroless plating. Conductive layer 154 can be one or more layers of Al, Cu, Sn, Ni, Au, Ag, or other suitable electrically conductive material. Conductive layer 154 is electrically connected to conductive vias 146.

In another embodiment, conductive vias 146 are formed through substrate 144 after forming conductive layers 150 and/or 154. Conductive layers 150 and 154 can be formed prior to insulating layers 148 and 152.

Conductive layers 150 and 154 and conductive vias 146 constitute a z-direction vertical interconnect structure through substrate 144. The combination of substrate 144, conductive vias 146, and conductive layers 150 and 154 constitute pre-formed interposer frame 156. A plurality of die openings 158 is formed through interposer frame 156, each die opening 158 having sufficient area to contain semiconductor die 124. The pre-formed interposer frame 156 is positioned over carrier 140 and mounted to interface layer 142.

Figure 4C:
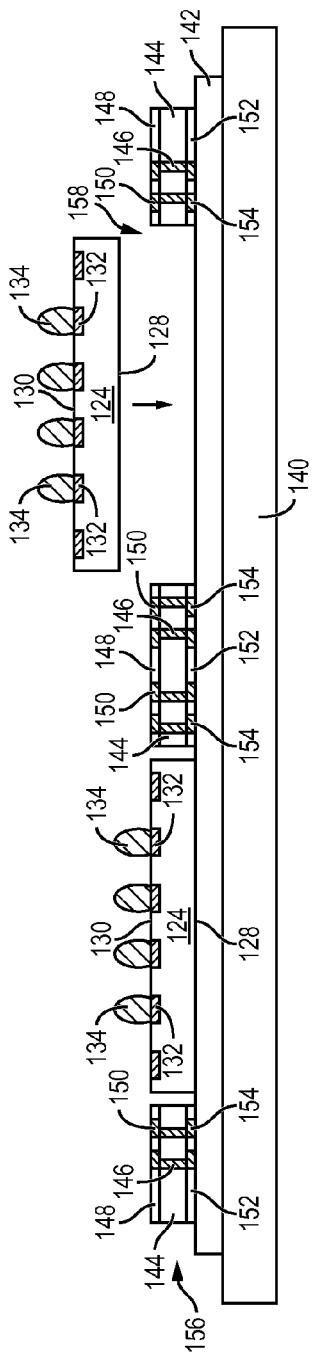

FIG. 4c shows the pre-formed interposer frame 156 mounted to carrier 140 and interface layer 142. Semiconductor die 124 from FIGS. 3*a*-3*c* is positioned over and mounted to interface layer 122 using a pick and place operation. Die openings 158 aid with alignment of semiconductor die 124. Semiconductor die 124 is embedded within die openings 158 of interposer frame 156 with back surface 128 oriented toward carrier 140 and interface layer 142.

Figure 4D:
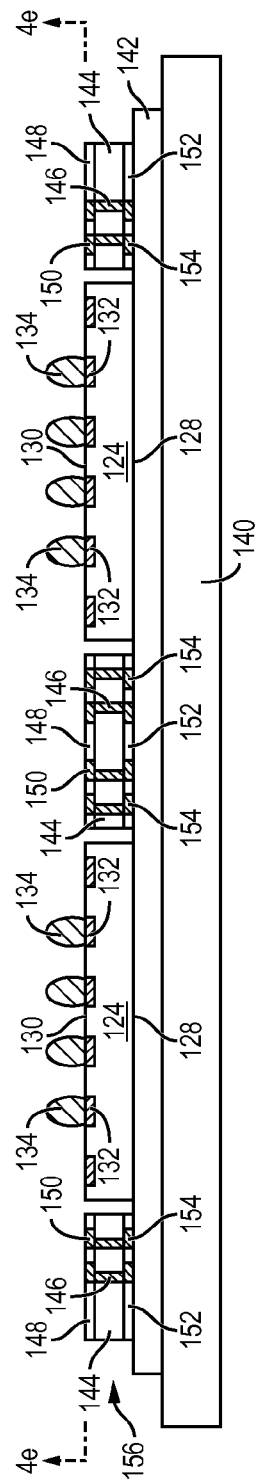
Figure 4E:
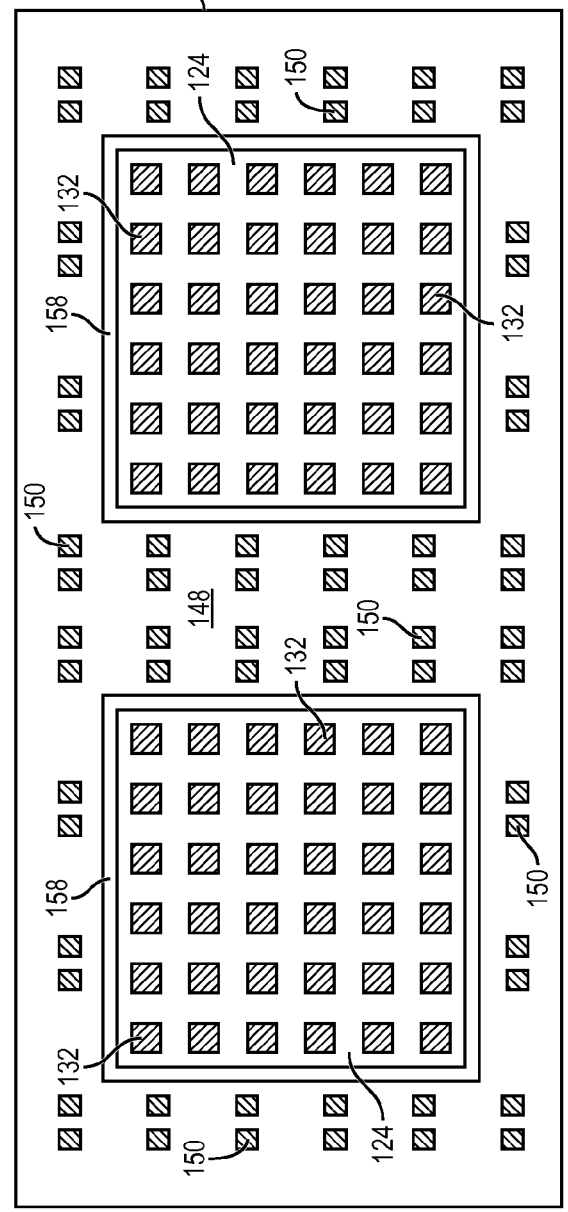

FIG. 4*d* shows semiconductor die 124 mounted to carrier 140 within die openings 158 of interposer frame 156. FIG. 4*e* shows a plan view of semiconductor die 124 mounted within die openings 158 of interposer frame 156. In another embodiment, semiconductor die 124 is first mounted to carrier 140 and interposer frame 156 is mounted to carrier 140 after mounting the semiconductor die.

Figure 4F:
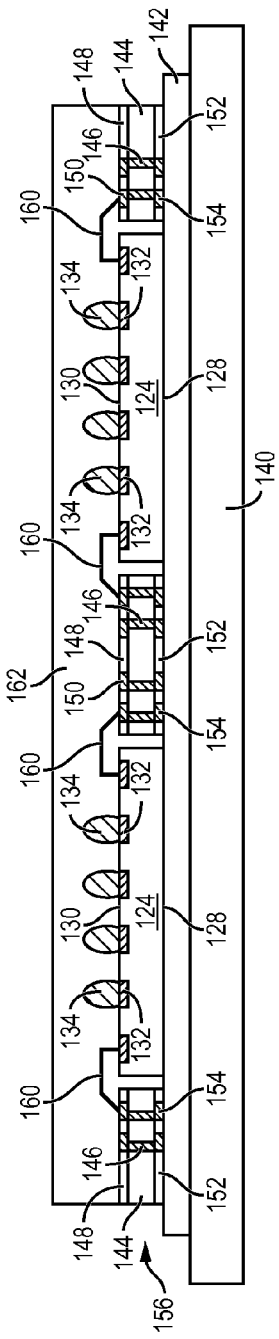

In FIG. 4*f*, a plurality of bond wires 160 is formed between contact pad 132 of semiconductor die 124 and conductive layer 150 of interposer frame 156. The number of bumps 134 and bond wires 160 is determined by the electrical functionality and vertical interconnect requirements of semiconductor die 124.

An encapsulant or molding compound 162 is deposited over semiconductor die 124 and interposer frame 156 and in the gap between the die and interposer frame using a paste printing, compressive molding, transfer molding, liquid encapsulant molding, vacuum lamination, spin coating, or other suitable applicator. In another embodiment, encapsulant 162 is formed using film assisted mold (FAM). Encapsulant 162 can be polymer composite material, such as epoxy resin with filler, epoxy acrylate with filler, or polymer with proper filler. Encapsulant 162 is non-conductive and environmentally protects the semiconductor device from external elements and contaminants.

Figure 4G:
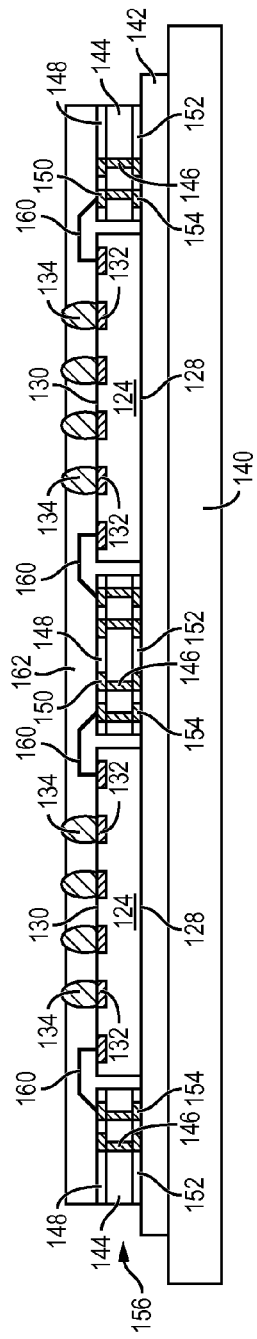

In FIG. 4*g*, a portion of encapsulant 162 is removed by an etching or grinding process to expose bumps 134. Alternatively, encapsulant 162 is deposited with the proper volume to leave bumps 134 exposed.

Figure 4H:
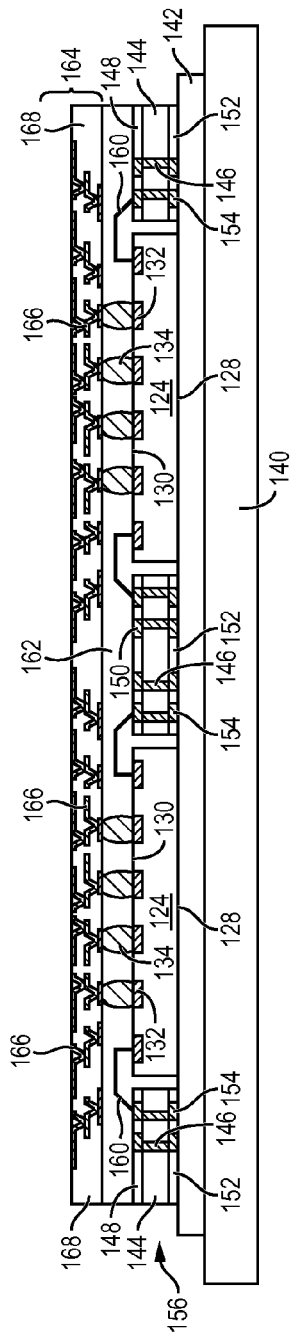

In FIG. 4*h*, a build-up interconnect structure 164 is formed over encapsulant 162 and bumps 134. The build-up interconnect structure 164 includes an electrically conductive layer or RDL 166 formed using a patterning and metal deposition process such as sputtering, electrolytic plating, and electroless plating. Conductive layer 166 can be one or more layers of Al, Cu, Sn, Ni, Au, Ag, or other suitable electrically conductive material. One portion of conductive layer 166 is electrically connected to bumps 134 of semiconductor die 124. Other portions of conductive layer 166 can be electrically common or electrically isolated depending on the design and function of semiconductor die 124.

An insulating or passivation layer 168 is formed around conductive layer 166 for electrical isolation using PVD, CVD, printing, spin coating, spray coating, sintering or thermal oxidation. The insulating layer 168 contains one or more layers of $SiO_2$, $Si_3N_4$, SiON, $Ta_2O_5$, $Al_2O_3$, or other material having similar insulating and structural properties. A portion of insulating layer 168 can be removed by an etching process to expose conductive layer 166 for additional electrical interconnect. In one embodiment, build-up interconnect structure 164 contains a Cu wiring and solder mask layer, Cu wiring with prepreg or ajinomoto build-up film (ABF) and solder mask layer, and BCB or polyimide insulating layer.

Figure 4I:
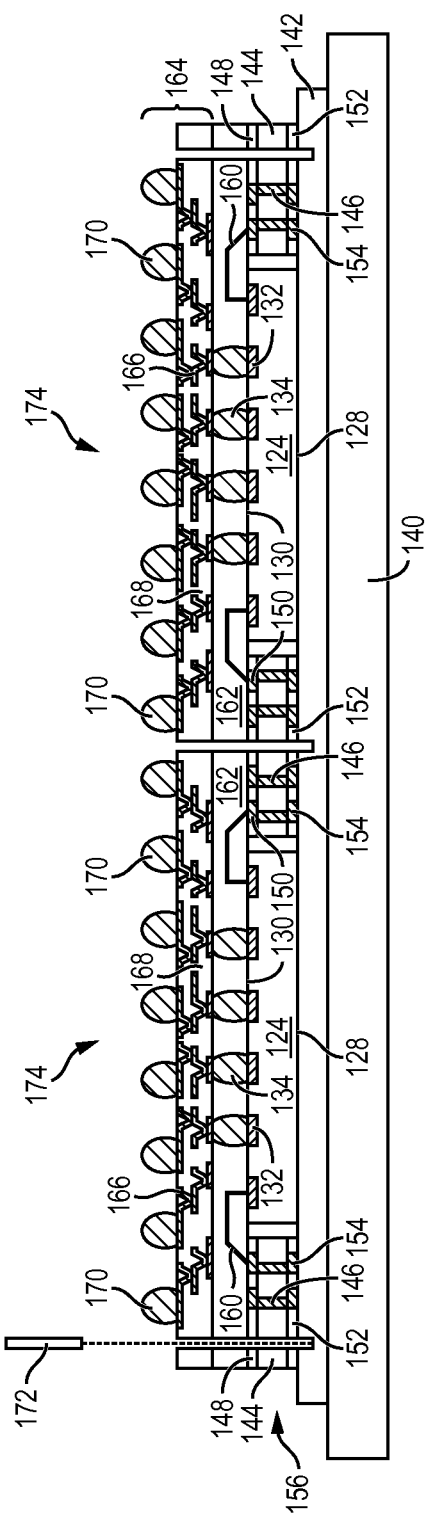

In FIG. 4*i*, an electrically conductive bump material is deposited over build-up interconnect structure 164 and electrically connected to the exposed portion of conductive layer 166 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 166 using a suitable attachment or bonding process. In one embodiment, the bump material is reflowed by heating the material above its melting point to form spherical balls or bumps 170. In some applications, bumps 170 are reflowed a second time to improve electrical contact to conductive layer 166. An under bump metallization (UBM) can be formed under bumps 170. The bumps can also be compression bonded to conductive layer 166. Bumps 170 represent one type of interconnect structure that can be formed over conductive layer 166. The interconnect structure can also use stud bump, micro bump, or other electrical interconnect.

Semiconductor die 124 are singulated through interposer frame 156, encapsulant 162, and build-up interconnect structure 164 with saw blade or laser cutting tool 172 into individual Fo-WLCSP 174. Carrier 140 and interface layer 142 are removed by chemical etching, mechanical peeling, chemical mechanical polish (CMP), mechanical grinding, thermal bake, UV light, laser scanning, or wet stripping to expose interposer frame 156.

Figure 5:
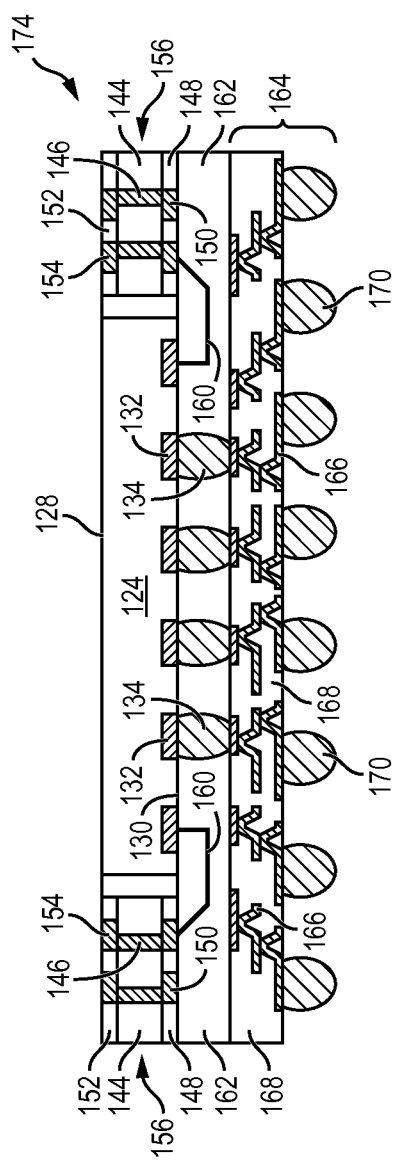
FIG. 5 illustrates the interposer frame and embedded semiconductor die electrically connected with bumps and bond wires.

FIG. 5 shows Fo-WLCSP 174 after singulation. Semiconductor die 124 is electrically connected through contact pads 132 and bumps 134 to build-up interconnect structure 164. Semiconductor die 124 is also electrically connected through bond wires 160 to conductive layer 150 of interposer frame 156 for z-direction vertical electrical interconnect to other semiconductor devices. With semiconductor die 124 mounted within the die opening of interposer frame 156, back surface 128 is exposed for heat dissipation. The height of Fo-WLCSP 174 is reduced with semiconductor die 124 mounted within the die opening of interposer frame 156. Bumps 170 have a fine pitch for greater routing density.

FIG. 6 shows an embodiment of Fo-WLCSP 180, similar to FIG. 5, with semiconductor die 124 mounted with its back surface 128 adjacent to a surface of interposer frame 182 using die attach adhesive 184. The interposer frame 182 is similar to interposer frame 156, i.e., conductive via 186 formed through substrate 188 and insulating layers 189 and 191 and conductive layers 190 and 192 formed over opposing surfaces of substrate 188, but without die openings. Semiconductor die 124 is electrically connected through contact pads 132 and bumps 134 to build-up interconnect structure 164. Semiconductor die 124 is also electrically connected through bond wires 160 to conductive layer 192 of interposer frame 182 for z-direction vertical electrical interconnect to other semiconductor devices.

FIG. 7 shows an embodiment of Fo-WLCSP 194, similar to FIG. 5, with bumps 196 disposed between conductive layer 150 of interposer frame 156 and conductive layer 166 of build-up interconnect structure 164. Bumps 196 provide additional z-direction vertical interconnect between interposer frame 156 and build-up interconnect structure 164.

Figure 8:
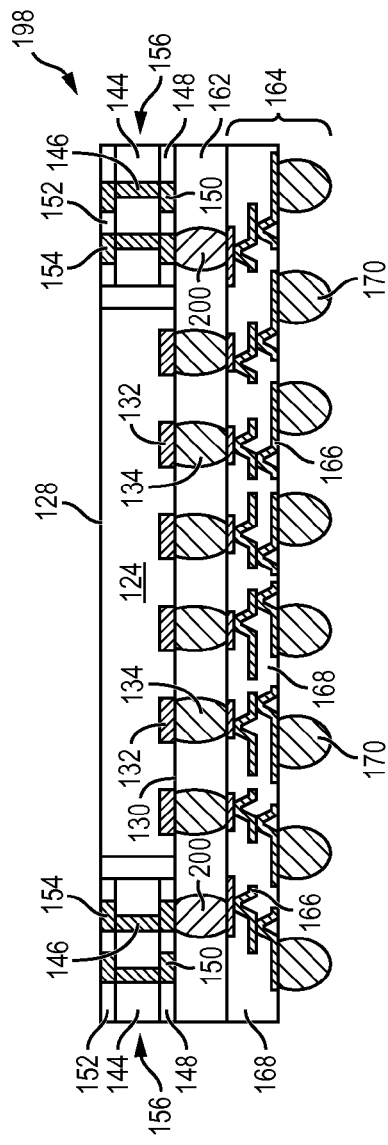
FIG. 8 illustrates the interposer frame and embedded semiconductor die electrically connected with bumps.

FIG. 8 shows an embodiment of Fo-WLCSP 198, similar to FIG. 5, but without bond wires between semiconductor die 124 and interposer frame 156. Bumps 200 are disposed between conductive layer 150 of interposer frame 156 and conductive layer 166 of build-up interconnect structure 164. Semiconductor die 124 is electrically connected through bumps 134, build-up interconnect structure 162, and bumps 200 to interposer frame 156.

Figure 9:
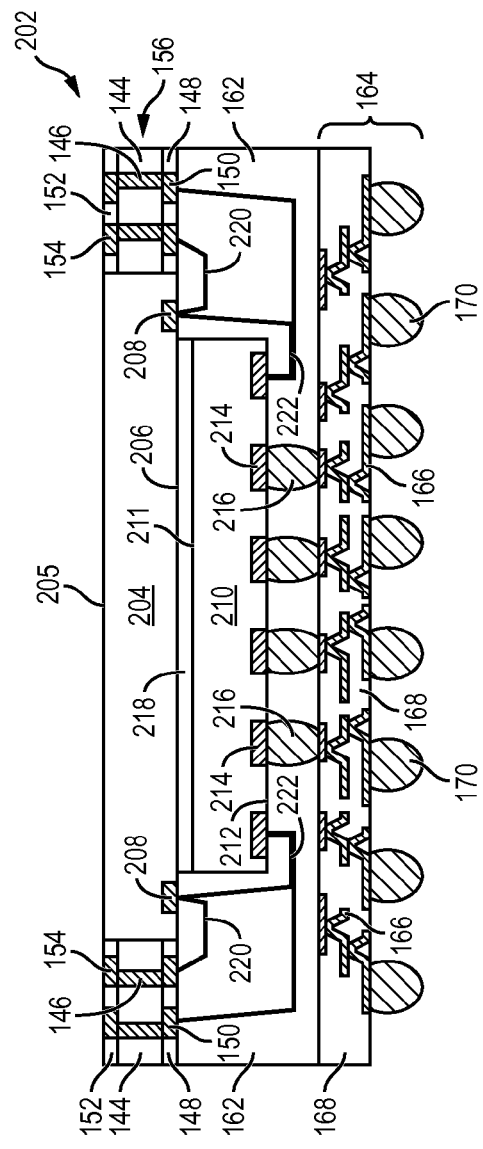
FIG. 9 illustrates the interposer frame and embedded stacked semiconductor die electrically connected with bumps and bond wires.

FIG. 9 shows an embodiment of Fo-WLCSP 202, similar to FIG. 5, with stacked semiconductor die. More specifically, semiconductor die 204 has a back surface 205 and active surface 206 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 206 to implement analog circuits or digital circuits, such as DSP, ASIC, memory, or other signal processing circuit. Semiconductor die 204 may also contain IPDs, such as inductors, capacitors, and resistors, for RF signal processing. Contact pads 208 are formed over active surface 206 and electrically connected to circuits within the active surface. Semiconductor die 204 is disposed within the die opening of interposer frame 156.

Semiconductor die 210 has a back surface 211 and active surface 212 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 212 to implement analog circuits or digital circuits, such as DSP, ASIC, memory, or other signal processing circuit. Semiconductor die 210 may also contain IPDs, such as inductors, capacitors, and resistors, for RF signal processing. Contact pads 214 are formed over active surface 212 and electrically connected to circuits within the active surface. Bumps 216 are formed over contact pads 214. Semiconductor die 210 is mounted with its back surface 211 to active surface 206 of semiconductor die 204 with die attach adhesive 218.

A plurality of bond wires 220 is formed between contact pad 208 of semiconductor die 204 and conductive layer 150 of interposer frame 156. A plurality of bond wires 222 is formed between contact pad 214 of semiconductor die 210 and conductive layer 150 of interposer frame 156, as well as contact pads 208 of semiconductor die 204. The number of bond wires 220 and 222 is determined by the electrical functionality and vertical interconnect requirements of semiconductor die 204 and 210.

Semiconductor die 204 is electrically connected through contact pads 208 and bond wires 220 to interposer frame 156. Semiconductor die 210 is electrically connected through contact pads 214 and bumps 216 to build-up interconnect structure 164. Semiconductor die 210 is also electrically connected through bond wires 222 to contact pads 208 of semiconductor die 204 and to conductive layer 150 of interposer frame 156 for z-direction vertical electrical interconnect to other semiconductor devices.

Figure 10:
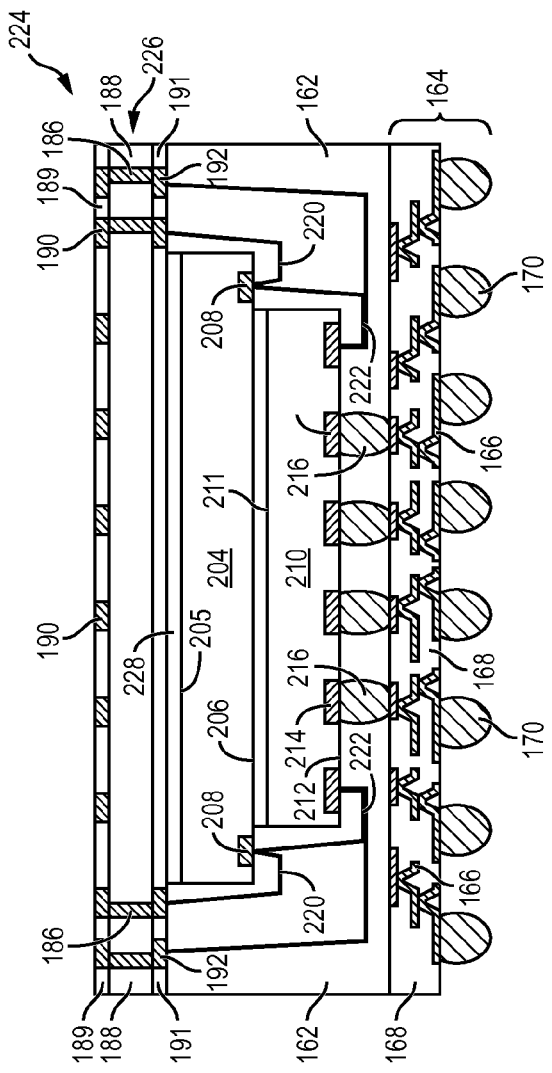
FIG. 10 illustrates stacked semiconductor die mounted adjacent to the interposer frame and electrically connected with bumps and bond wires.

FIG. 10 shows an embodiment of Fo-WLCSP 224, similar to FIG. 9, with semiconductor die 204 mounted with its back surface 205 adjacent to a surface of interposer frame 226 using die attach adhesive 228. The interposer frame 226 is similar to interposer frame 182, i.e., conductive vias 186 formed through substrate 188 and insulating layers 189 and 191 and conductive layers 190 and 192 formed over opposing surfaces of the substrate, but without die openings. Semiconductor die 204 is electrically connected through contact pads 208 and bond wires 220 to interposer frame 226. Semiconductor die 210 is electrically connected through contact pads 214 and bumps 216 to build-up interconnect structure 164. Semiconductor die 210 is also electrically connected through bond wires 222 to contact pads 208 of semiconductor die 204 and to interposer frame 226 for z-direction vertical electrical interconnect to other semiconductor devices.

Figure 11:
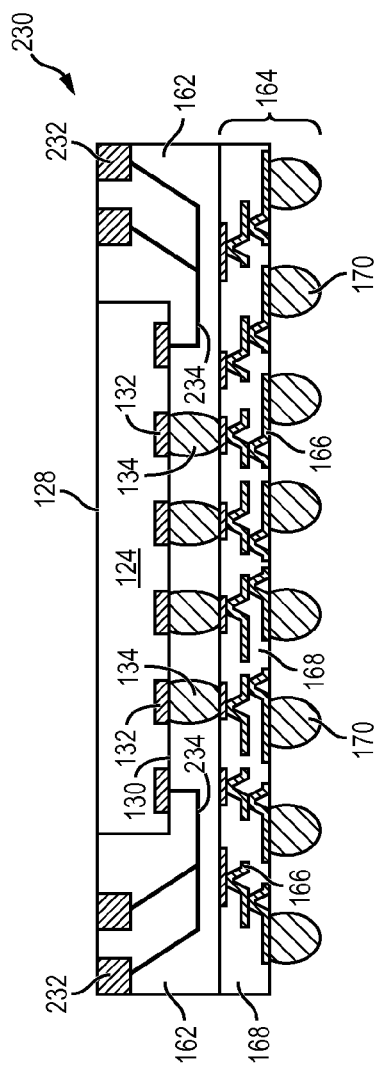
FIG. 11 illustrates a leadframe interposer and embedded semiconductor die electrically connected with bumps and bond wires.

FIG. 11 shows an embodiment of Fo-WLCSP 230 with leadframe interposer 232. In one embodiment, leadframe interposer 232 is Cu. Semiconductor die 124 is disposed within a die opening of leadframe interposer 232. Semiconductor die 124 is electrically connected through contact pads 132 and bumps 134 to build-up interconnect structure 164. Semiconductor die 124 is also electrically connected through bond wires 234 to leadframe interposer 232.

Figure 12:
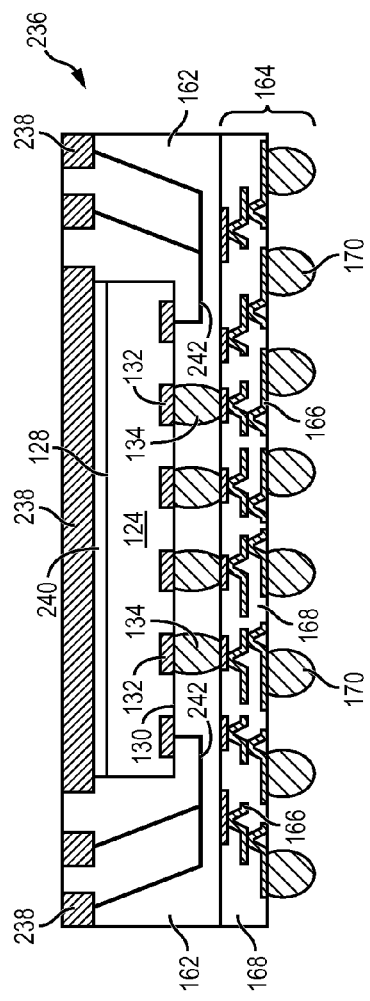
FIG. 12 illustrates the semiconductor die mounted to the leadframe interposer and electrically connected with bumps and bond wires.

FIG. 12 shows an embodiment of Fo-WLCSP 236, with leadframe interposer 238. In one embodiment, leadframe interposer 238 is Cu. Semiconductor die 124 is mounted with its back surface 128 to leadframe interposer 238 with die attach adhesive 240. Semiconductor die 124 is electrically connected through contact pads 132 and bumps 134 to build-up interconnect structure 164. Semiconductor die 124 is also electrically connected through bond wires 242 to leadframe interposer 238.

Figure 13:
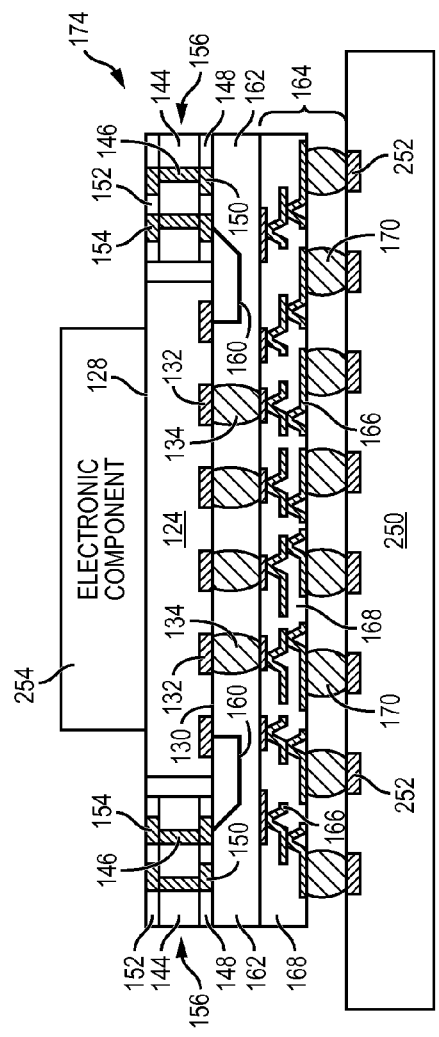
FIG. 13 illustrates options for 3D stacking of an electronic component over the semiconductor die embedded within the interposer frame and PCB.

FIG. 13 shows an arrangement for 3D package stacking. Fo-WLCSP 174 from FIG. 5 is mounted to substrate or PCB 250. Bumps 170 are electrically connected to contact pads 252 formed over PCB 250 for interconnect between semiconductor die 124 and PCB 250. The Fo-WLCSP embodiments of FIGS. 6-12 can also be mounted to PCB 250.

Figure 14A:
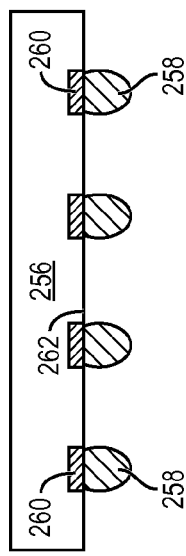
FIGS. 14a-14e illustrate various electronic components for stacking over the interposer frame and embedded semiconductor die.
Figure 14B:
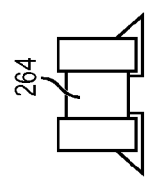

An electronic component 254 is mounted to Fo-WLCSP 174. The electronic component 254 can be implemented in various forms, e.g. land grid array (LGA), ball grid array (BGA), leaded semiconductor die, flipchip semiconductor die, wafer level package, or discrete passive device. For example, electronic component 254 can be a flipchip type semiconductor die 256 with bumps 258 formed over contact pads 260 on active surface 262, as shown in FIG. 14a. The electronic component 254 can be a discrete passive device 264, such as a capacitor, inductor, or capacitor, as shown in FIG. 14b.

Figure 14C:
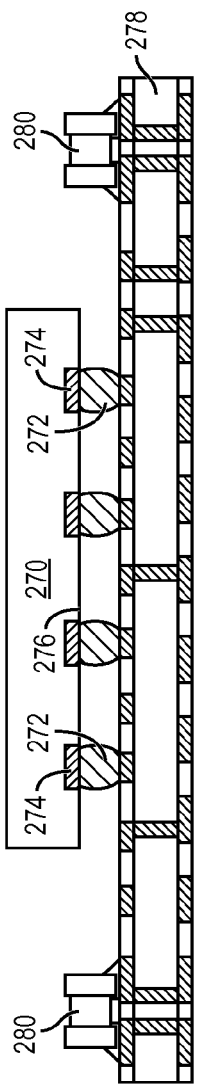

In another embodiment, FIG. 14c shows electronic component 254 implemented as semiconductor die 270 with bumps 272 formed over contact pads 274 on active surface 276. Semiconductor die 272 is mounted to interposer frame 278, which is similar to interposer frame 182. Discrete passive device 280, such as a capacitor, inductor, or capacitor, are mounted to interposer frame 278. Semiconductor die 270 and discrete passive devices 280 are electrically connected through interposer frames 278 and 156 to semiconductor die 124 in Fo-WLCSP 174.

Figure 14D:
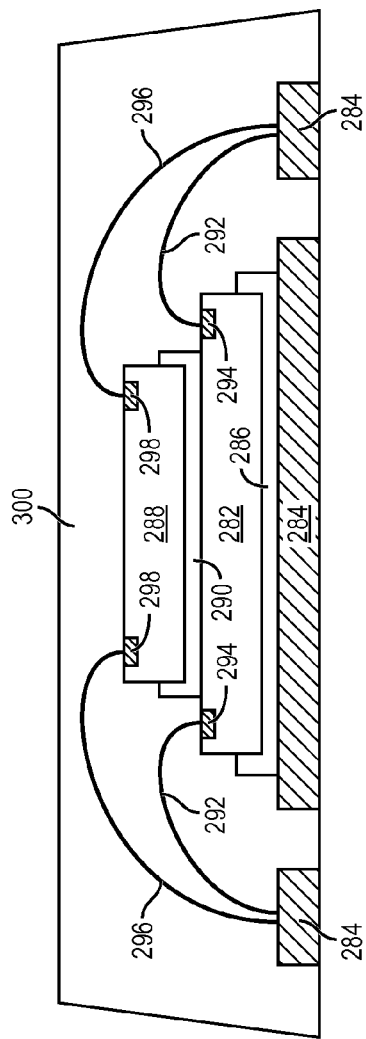

In another embodiment, FIG. 14d shows electronic component 254 implemented as stacked semiconductor die with a wire bond type semiconductor die 282 mounted to leadframe interposer 284 with die attach adhesive 286. A wire bond type semiconductor die 288 is mounted to semiconductor die 282 die attach adhesive 290. A plurality of bond wires 292 is formed between contact pads 294 on semiconductor die 282 and leadframe interposer 284. A plurality of bond wires 296 is formed between contact pads 298 on semiconductor die 288 and leadframe interposer 284. An encapsulant 300 is deposited over semiconductor die 282 and 288, bond wires 292 and 296, and leadframe interposer 284.

Figure 14E:
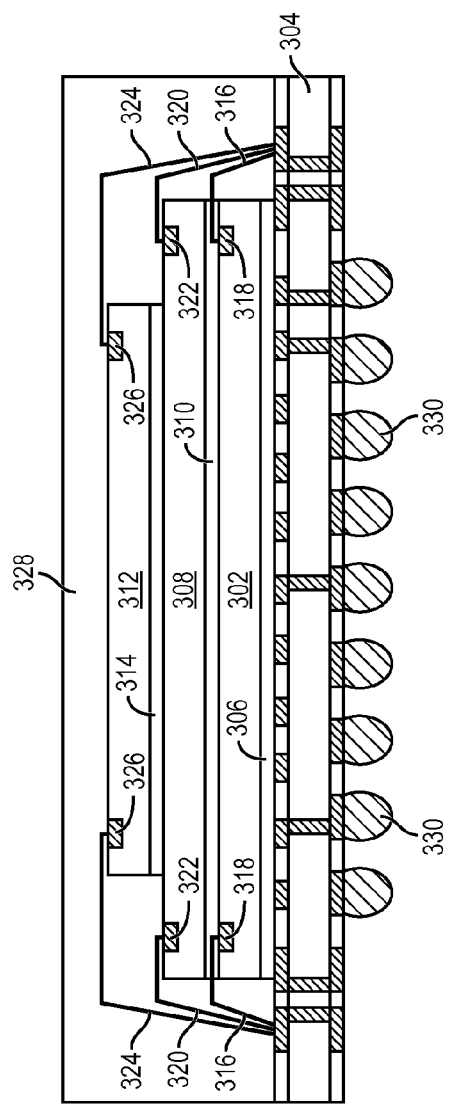

In another embodiment, FIG. 14e shows electronic component 254 implemented as stacked semiconductor die including semiconductor die 302 mounted to interposer frame 304 with die attach adhesive 306. The interposer frame 304 is similar to interposer frame 182. Semiconductor die 308 is mounted to semiconductor die 302 with die attach adhesive 310. Semiconductor die 312 is mounted to semiconductor die 310 with die attach adhesive 314. A plurality of bond wires 316 is formed between contact pads 318 on semiconductor die 302 and interposer frame 304. A plurality of bond wires 320 is formed between contact pads 322 on semiconductor die 308 and interposer frame 304. A plurality of bond wires 324 is formed between contact pads 326 on semiconductor die 312 and interposer frame 304. An encapsulant 328 is deposited over semiconductor die 302, 308, and 312, bond wires 316, 320, and 324, and leadframe interposer 304. A plurality of bumps 330 is formed over interposer frame 304 opposite the stacked semiconductor die.

In 3D semiconductor device stacking, the lower semiconductor device is typically arranged for high speed, high functionality with corresponding high I/O count and interconnect requirements. For example, semiconductor die 124 could be an ASIC or DSP. The greater number of bumps 134 and routing options through build-up interconnect structure 164 provide the requisite level of interconnect needed for high performance devices. The upper electronic component 254 is typically a memory device with lower I/O count. For example, semiconductor die 282 and 288 could be memory devices which are attached to Fo-WLCSP 174 containing the ASIC or DSP device. That is, semiconductor die 282 and 288 (memory devices) communicate with semiconductor die 124 (ASIC or DSP) through bond wires 160, 292, and 296, interposer frame 156, and leadframe interposer 284. The vertical interconnect capability of bumps 134 and build-up interconnect structure work well for DSP or ASIC type semiconductor die 124, while bond wires 160 and interposer frame 156 and bond wires 160 are suited for memory type semiconductor die 282 and 288.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   an interposer frame including a die opening formed completely through the interposer frame;
   a first semiconductor die disposed within the die opening of the interposer frame with a first surface of the first semiconductor die coplanar with a first surface of the interposer frame and a conductive bump formed on a second surface of the first semiconductor die; and
   a first interconnect structure formed between the first semiconductor die and interposer frame.

2. The semiconductor device of claim 1, further including an encapsulant deposited over the interposer frame and first semiconductor die.

3. The semiconductor device of claim 2, further including a third interconnect structure formed over the encapsulant.

4. The semiconductor device of claim 1, wherein the first interconnect structure includes a bump or bond wire.

5. The semiconductor device of claim 1, further including a second semiconductor die disposed over the first semiconductor die.

6. The semiconductor device of claim 1, further including an electronic component disposed over the first semiconductor die.

7. The semiconductor device of claim 1, wherein the first interconnect structure includes a bond wire.

8. The semiconductor device of claim 1, wherein the conductive bump extends over a second surface of the interposer frame opposite the first surface of the interposer frame.

9. The semiconductor device of claim 1, wherein the first semiconductor die is disposed outside a footprint of the interposer frame.

* * * * *